United States Patent
Kim et al.

(10) Patent No.: US 8,120,416 B2
(45) Date of Patent: Feb. 21, 2012

(54) SEMICONDUCTOR INTEGRATED CIRCUIT

(75) Inventors: Kwan-Weon Kim, Ichon (KR); Jun-Ho Lee, Ichon (KR); Kun-Woo Park, Ichon (KR); Chang-Kyu Choi, Ichon (KR); Yong-Ju Kim, Ichon (KR); Sung-Woo Han, Ichon (KR); Jun-Woo Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/166,085

(22) Filed: Jul. 1, 2008

(65) Prior Publication Data

US 2009/0121786 A1    May 14, 2009

(30) Foreign Application Priority Data

Nov. 12, 2007  (KR) .................. 10-2007-0114970
Nov. 16, 2007  (KR) .................. 10-2007-0117092

(51) Int. Cl.
*H04B 1/10* (2006.01)

(52) U.S. Cl. ...................................... 327/551

(58) Field of Classification Search ................. None
See application file for complete search history.

(56) References Cited

U.S. PATENT DOCUMENTS

| | | | |
|---|---|---|---|
| 5,926,427 A | 7/1999 | Kim | |
| 5,969,929 A | 10/1999 | Kleveland et al. | |
| 6,060,946 A * | 5/2000 | Harima et al. | 327/551 |
| 6,157,203 A * | 12/2000 | Takahashi | 326/21 |
| 6,339,359 B1 * | 1/2002 | Kinoshita | 327/565 |
| 6,597,227 B1 * | 7/2003 | Yue et al. | 327/310 |
| 6,756,834 B1 * | 6/2004 | Tong et al. | 327/309 |
| 7,076,757 B2 * | 7/2006 | Hirata | 361/56 |
| 7,107,467 B2 | 9/2006 | Lee et al. | |
| 7,561,390 B2 * | 7/2009 | Furuta | 361/56 |
| 7,612,578 B2 * | 11/2009 | Chang et al. | 326/30 |
| 2003/0016049 A1 * | 1/2003 | Wei | 326/21 |

FOREIGN PATENT DOCUMENTS

| | | |
|---|---|---|
| JP | 05-343603 | 12/1993 |
| JP | 10-135336 | 5/1998 |
| KR | 101994003014 | 2/1994 |
| KR | 100213839 | 5/1999 |
| KR | 1020020002020 A | 1/2002 |
| KR | 1020050077992 A | 8/2005 |
| KR | 1020060023201 A | 3/2006 |

* cited by examiner

*Primary Examiner* — Lincoln Donovan
*Assistant Examiner* — Khareem E Almo
(74) *Attorney, Agent, or Firm* — Baker & McKenzie LLP

(57) ABSTRACT

A semiconductor integrated circuit can include a first voltage pad, a second voltage pad, and a voltage stabilizing unit that is connected between the first voltage pad and the second voltage pad. The first voltage pad can be connected to a first internal circuit, and the second voltage pad can be connected to a second internal circuit.

12 Claims, 5 Drawing Sheets

SEMICONDUCTOR INTEGRATED CIRCUIT

CROSS-REFERENCE TO RELATED PATENT APPLICATION

This application claims priority under 35 U.S.C. 119(a) to Korean Patent Applications No. 10-2007-0114970, filed on Nov. 12, 2007, and No. 10-2007-0117092, filed on Nov. 16, 2007, in the Korean Intellectual Property Office, the content of which is incorporated herein in its entirety by reference as if set forth in full.

BACKGROUND

1. Technical Field

The embodiments described herein relate to a semiconductor integrated circuit, and more particularly, to a semiconductor integrated circuit capable of reducing voltage noise to stabilize a voltage.

2. Related Art

Conventional Semiconductor integrated circuits are supplied with an operational voltage from outside the circuit. The voltage supplied from the outside is referred to as an external voltage.

A conventional semiconductor integrated circuit is supplied with the external voltage to generate a necessary internal voltage. The voltage generated inside the semiconductor integrated circuit is referred to as an internal voltage.

The external voltage or the internal voltage used to drive a conventional semiconductor integrated circuit needs to be maintained at a constant level at all times. That is, the external voltage or the internal voltage should be a DC voltage. The reason is that, when the level of the external voltage or the internal voltage used as a driving voltage varies, the semiconductor integrated circuit is likely to be erroneously operated.

When the external voltage is applied to the semiconductor integrated circuit, the external voltage is applied to a voltage pad of the semiconductor integrated circuit through a bonding wire. The bonding wire includes an inductance component. The inductance component causes a counter electromotive force having a polarity opposite to that of the external voltage. The stronger the counter electromotive force becomes, the larger the amount of noise included in the external voltage.

Therefore, when the external voltage has an excessively large amount of noise, that is, a large variation in level occurs in the external voltage, a large variation in the level of the internal voltage generated from the external voltage may occur.

When a large amount of noise is included in the external voltage, errors may occur in the semiconductor integrated circuit using the external voltage or the internal voltage as the driving voltage.

SUMMARY

A semiconductor integrated circuit capable of reducing the amount of noise of an external voltage to stabilize a voltage is described herein.

In one aspect, a semiconductor integrated circuit can include: a first voltage pad; a second voltage pad; and a voltage stabilizing unit that is connected between the first voltage pad and the second voltage pad, is disclosed. In the semiconductor integrated circuit, the first voltage pad can be connected to a first internal circuit, and the second voltage pad can be connected to a second internal circuit.

In another aspect, a semiconductor integrated circuit can include: a first internal circuit through which a first current can flow; a second internal circuit through which a second current can flow; and a voltage stabilizing unit that can be configured such that a portion of the first current and a portion of the second current can flow through a first ground pad, and the other of the first current and the other of the second current can flow through the second ground pad, is disclosed.

In yet another aspect, a semiconductor integrated circuit can include: a first capacitor that can be connected between a voltage terminal and a ground terminal of a first internal circuit; a second capacitor that can be connected between a voltage terminal and a ground terminal of a second internal circuit; and a voltage stabilizing unit that can be configured to apply noise of the voltage supplied to the first capacitor to the second capacitor, is disclosed.

These and other features, aspects, and embodiments are described below in the section entitled "Detailed Description."

DETAILED DESCRIPTION

Figure 1:
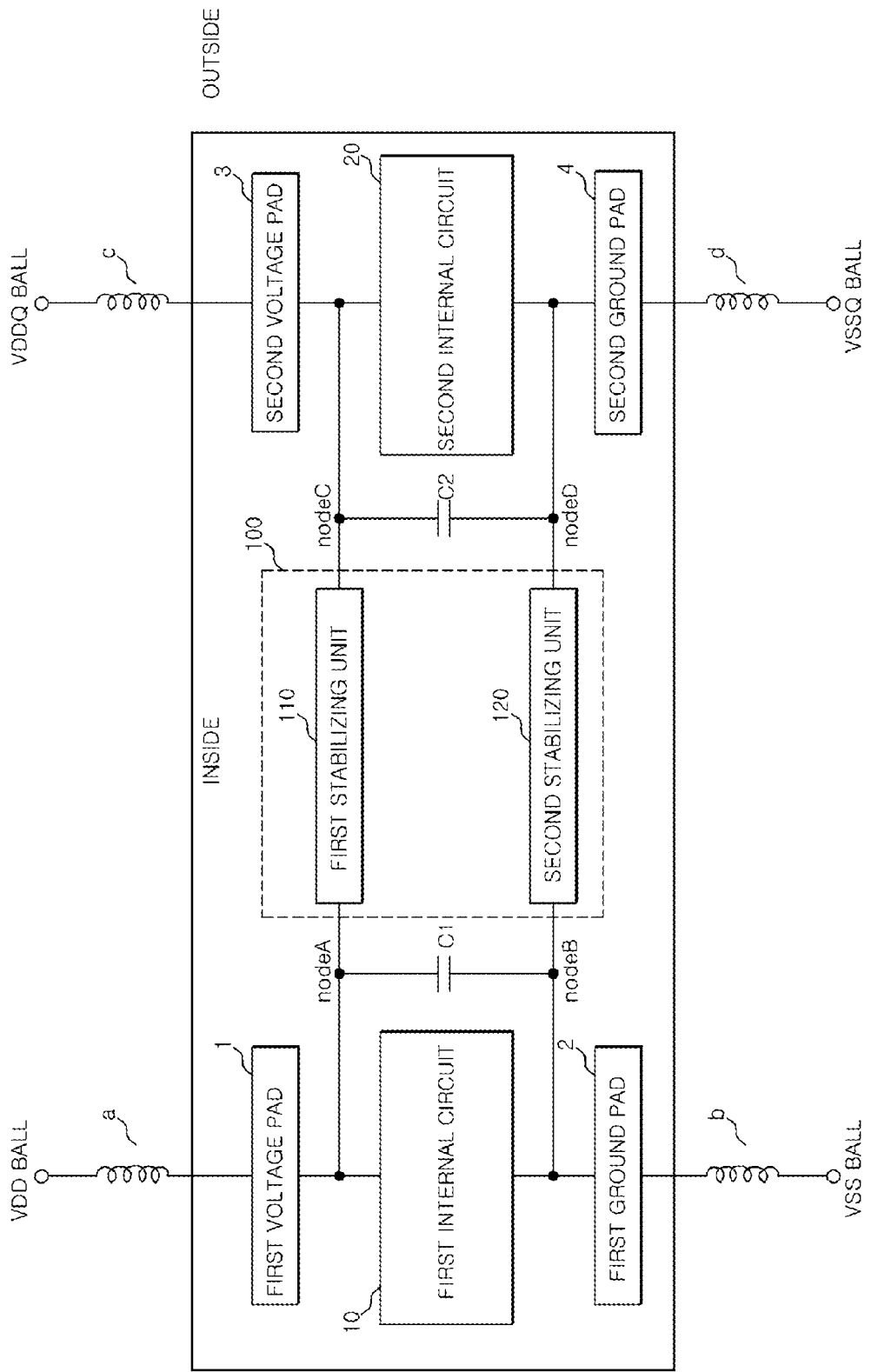
FIG. 1 is a diagram illustrating the structure of a semiconductor integrated circuit, in accordance with one embodiment.

As shown in FIG. 1, a semiconductor integrated circuit, in accordance with one embodiment, can include a first voltage pad 1, a first ground pad 2, a second voltage pad 3, a second ground pad 4, a first internal circuit 10, a second internal circuit 20, and a voltage stabilizing unit 100. The first voltage pad 1 can be supplied with a first external voltage (VDD), and the second voltage pad 3 can be supplied with a second external voltage (VDDQ). The first ground pad 2 can be supplied with a first ground voltage (VSS), and the second ground pad 4 can be supplied with a second ground voltage (VSSQ). The first external voltage (VDD) can be used as a driving voltage by a peripheral circuit of the semiconductor integrated circuit, and the second external voltage (VDDQ) can be used as a driving voltage by a data transmission circuit. The first external voltage (VDD) and the second external voltage (VDDQ) can have the same target level, and the first ground voltage (VSS) and the second ground voltage (VSSQ) can have the same target level.

The first voltage pad 1 can be supplied with the first external voltage (VDD) through a first external connection terminal (VDD ball) and a first bonding wire "a."

The first ground pad 2 can be supplied with the first ground voltage (VSS) through a second external connection terminal (VSS ball) and a second bonding wire "b."

The first internal circuit 10 can be connected between the first voltage pad 1 and the first ground pad 2. A node between the first internal circuit 10 and the first voltage pad 1 can be referred to as a first node (node A). A node between the first internal circuit 10 and the first ground pad 2 can be referred to as a second node (node B).

The second voltage pad 3 can be supplied with the second external voltage (VDDQ) through a third external connection terminal (VDDQ ball) and a third bonding wire "c."

The second ground pad 4 can be supplied with the second ground voltage (VSSQ) through a fourth external connection terminal (VSSQ ball) and a fourth bonding wire "d."

The second internal circuit 20 can be connected between the second voltage pad 3 and the second ground pad 4. A node between the second internal circuit 20 and the second voltage pad 3 can be referred to as a third node (node C). A node between the second internal circuit 20 and the second ground pad 4 can be referred to as a fourth node (node D).

The voltage stabilizing unit 100 can include a first stabilizing unit 110 and a second stabilizing unit 120. The voltage stabilizing unit 100 may include only the first stabilizing unit 110 or the second stabilizing unit 120.

The first stabilizing unit 110 can be connected between the first node (node A) and the third node (node C).

Figure 2A:
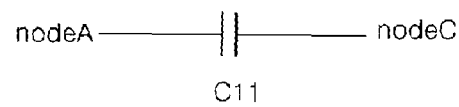
FIGS. 2A, 2B, and 2C are diagrams illustrating the detailed structure of a first stabilizing unit shown in FIG. 1, in accordance with one embodiment.

As shown in FIG. 2A, the first stabilizing unit 110 can include a first capacitor C11. The first capacitor C11 can be configured to serve as a filter that does not transmit DC components, but transmits AC components. The larger the amount of noise included in the first external voltage (VDD) and the second external voltage (VDDQ) respectively applied to the first node (node A) and the third node (node C) becomes, the smaller the impedance of the first capacitor C11 becomes. The first capacitor C11 can be connected between the first node (node A) and the third node (node C).

Figure 2B:
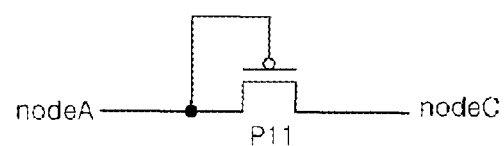

As shown in FIG. 2B, the first stabilizing unit 110 can include a first transistor P11. The first transistor P11 can be configured to be a switching element that connects the first node (node A) and the third node (node C) when the potential level of the first node (node A) is lower than that of the third node (node C) by a predetermined potential level. The first transistor P11 can have a drain and a source connected between the first node (node A) and the third node (node C), and a gate connected to the first node (node A).

Figure 2C:
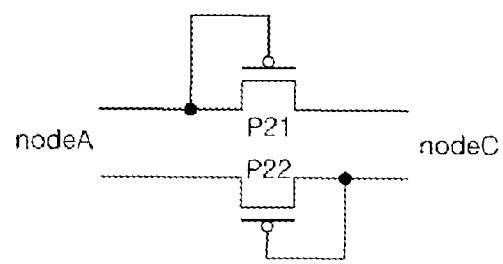

As shown in FIG. 2C, the first stabilizing unit 110 can include a second transistor P21 and a third transistor P22. The second transistor P21 and the third transistor P22 can be configured to be switching elements that connect the first node (node A) and the third node (node C), when a difference between the potential level of the first node (node A) and the potential level of the third node (node C) is higher than a predetermined potential level. The second transistor P21 can have a drain and a source connected between the first node (node A) and the third node (node C) and a gate connected to the first node (node A). Therefore, the second transistor P21 can be configure to be turned on when the first external voltage (VDD) is lower than the second external voltage (VDDQ) by a predetermined voltage level. The third transistor P22 can have a drain and a source connected between the first node (node A) and the third node (node C) and a gate connected to the third node (node C). Therefore, the third transistor P22 can be configured to be turned on when the second external voltage (VDDQ) is lower than the first external voltage (VDD) by a predetermined voltage level.

The second stabilizing unit 120 can be connected between the second node (node B) and the fourth node (node D).

Figure 3A:
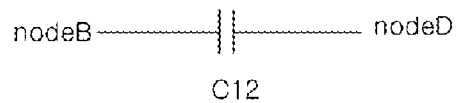
FIGS. 3A, 3B, and 3C are diagrams illustrating the detailed structure of a second stabilizing unit shown in FIG. 1, in accordance with one embodiment.

As shown in FIG. 3A, the second stabilizing unit 120 can include a second capacitor C12. The second capacitor C12 can be configured to serve as a filter that does not transmit DC components, but transmit AC components. The larger the amount of noise included in the first ground voltage (VSS) and the second ground voltage (VSSQ) respectively applied to the second node (node B) and the fourth node (node D) becomes, the smaller the impedance of the second capacitor C12 becomes. The second capacitor C12 can be connected between the second node (node B) and the fourth node (node D).

Figure 3B:
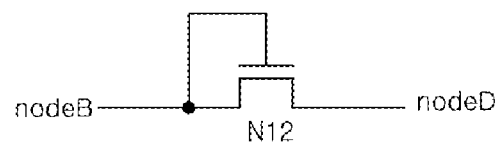

As shown in FIG. 3B, the second stabilizing unit 120 can include a fourth transistor N12. The fourth transistor N12 can be configured to be a switching element that connects the second node (node B) and the fourth node (node D) when the potential level of the second node (node B) is higher than that of the fourth node (node D) by a predetermined potential level. The fourth transistor N12 can have a drain and a source connected between the second node (node B) and the fourth node (node D), and a gate connected to the second node (node B).

Figure 3C:
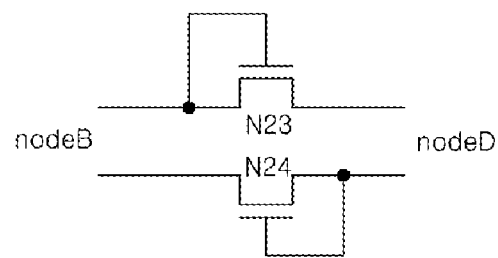

As shown in FIG. 3C, the second stabilizing unit 120 can include a fifth transistor N23 and a sixth transistor N24. The fifth transistor N23 and the sixth transistor N24 can be configured to be switching elements that connect the second node (node B) and the fourth node (node D), when a difference between the potential level of the second node (node B) and the potential level of the fourth node (node D) is higher than a predetermined potential level. The fifth transistor N23 can have a drain and a source connected between the second node (node B) and the fourth node (node D) and a gate connected to the second node (node B). Therefore, the fifth transistor N23 can be configured to be turned on when the first external voltage (VDD) is higher than the second external voltage (VDDQ) by a predetermined voltage level. The sixth transistor N24 can have a drain and a source connected between the second node (node B) and the fourth node (node D) and a gate connected to the fourth node (node D). Therefore, the sixth transistor N24 can be configured to be turned on when the second external voltage (VDDQ) is higher than the first external voltage (VDD) by a predetermined voltage level.

The semiconductor integrated circuit having the above-mentioned structure according to this embodiment can be configured to operate as follows.

First, the structure in which the first stabilizing unit 110 and the second stabilizing unit 120 shown in FIG. 1 respectively can include the first capacitor C11 and the second capacitor C12 serving as filters, as shown in FIGS. 2A and 3A, will be described below.

A first current and a second current can flow through the first internal circuit 10 and the second internal circuit 20, respectively.

The first current and the second current respectively flowing through the first internal circuit 10 and the second internal circuit 20 can be generated by the voltages applied to the first voltage pad 1 and the second voltage pad 3.

The first stabilizing unit 110 connected between the first voltage pad 1 and the second voltage pad 3 can be configured to apply noise components of the second external voltage (VDDQ) supplied from the second voltage pad 3, that is, AC components to the first internal circuit 10. That is, the first internal circuit 10 can be configured to be simultaneously supplied with the first external voltage (VDD) and the second external voltage (VDDQ).

Consequently, the first internal circuit 10 can be connected to the first voltage pad 1 and the second voltage pad 3. The first internal circuit 10 can be connected to the first bonding wire "a" and the third bonding wire "c" connected in parallel to each other through the first stabilizing unit 110. Therefore, a parallel circuit of the first bonding wire "a" and the third bonding wire "c" can be configured to enable the first internal circuit 10 to be supplied with a driving voltage with a smaller amount of noise, as compared to the structure in which the first internal circuit 10 is supplied with a driving voltage through only the first bonding wire "a." This is because a total inductance of the two bonding wires connected in parallel to each other is smaller than that of one bonding wire, resulting in a reduction in counter electromotive force caused by the inductance.

The first stabilizing unit 110 connected between the first voltage pad 1 and the second voltage pad 3 can be configured to apply noise components of the first external voltage (VDD) supplied from the first voltage pad 1, that is, AC components to the second internal circuit 20. That is, the second internal circuit 20 can be configured to be simultaneously supplied with the first external voltage (VDD) and the second external voltage (VDDQ).

Consequently, the second internal circuit 20 can be connected to the first voltage pad 1 and the second voltage pad 3. The second internal circuit 20 can be connected to the first bonding wire "a" and the third bonding wire "c" connected in parallel to each other through the first stabilizing unit 110. Therefore, a parallel structure of the first bonding wire "a" and the third bonding wire "c" can enable the second internal circuit 20 to be supplied with a driving voltage with a smaller amount of noise, as compared to the structure in which the second internal circuit 20 is supplied with a driving voltage through only the third bonding wire "c." This is because a total inductance of the two bonding wires connected in parallel to each other is smaller than that of one bonding wire, resulting in a reduction in counter electromotive force caused by the inductance.

A portion of the first current flowing through the first internal circuit 10 can flow to the first ground pad 2, and the other of the first current can flow to the second ground pad 4 through the second stabilizing unit 120. Therefore, the first internal circuit 10 can be connected to the second bonding wire "b" and the fourth bonding wire "d" connected in parallel to each other through the second stabilizing unit 120. That is, since the first internal circuit 10 can be connected to two bonding wires connected in parallel to each other, the first internal circuit 10 can be supplied with a driving voltage with a smaller amount of noise, as compared to the structure in which the first internal circuit 10 is connected to one bonding wire.

A portion of the second current flowing through the second internal circuit 20 can flow to the second ground pad 4, and the other of the second current can flow to the first ground pad 2 through the second stabilizing unit 120. Therefore, the second internal circuit 20 can be connected to the second bonding wire "b" and the fourth bonding wire "d" connected in parallel to each other through the second stabilizing unit 120. That is, since the second internal circuit 20 can be connected to two bonding wires connected in parallel to each other, the second internal circuit 20 can be supplied with a driving voltage with a smaller amount of noise, as compared to the structure in which the second internal circuit 20 is connected to one bonding wire.

Second, the structure in which the first stabilizing unit 110 and the second stabilizing unit 120 shown in FIG. 1 respectively can include the first transistor P11 and the fourth transistor N12 having switching functions, as shown in FIGS. 2B and 3B, will be described below.

The first stabilizing unit 110 can be configured to connect the first node (node A) and the third node (node C) when the potential level of the first node (node A) is lower than that of the third node (node C) by a predetermined potential level. In this case, the predetermined potential level means a threshold voltage of the first transistor P11.

That is, the first internal circuit 10 can be supplied with the first external voltage (VDD), and then simultaneously supplied with the first external voltage (VDD) and the second external voltage (VDDQ) when the first external voltage (VDD) is lowered, this is, when the first external voltage (VDD) and the second external voltage (VDDQ) have the same target level and only the first external voltage (VDD) is lowered.

Accordingly, when the first external voltage (VDD) is lowered, the first internal circuit 10 can be connected to the first bonding wire "a" and the third bonding wire "c" connected in parallel to each other through the first stabilizing unit 110. Therefore, since the first internal circuit 10 can be connected to two bonding wires connected in parallel to each other, the first internal circuit 10 can be supplied with a driving voltage with a smaller amount of noise, as compared to the structure in which the first internal circuit 10 is connected to one bonding wire.

The second stabilizing unit 120 can be configured to connect the second node (node B) and the fourth node (node D) when the potential level of the second node (node B) is higher than that of the fourth node (node D) by a predetermined potential level. In this case, the predetermined potential level means a threshold voltage of the fourth transistor N12.

That is, the first internal circuit 10 can be supplied with the first ground voltage (VSS), and then simultaneously supplied with the first ground voltage (VSS) and the second ground voltage (VSSQ) when the first ground voltage (VSS) is higher than the second ground voltage (VSSQ), this is, when the first ground voltage (VSS) and the second ground voltage (VSSQ) have the same target level and only the first ground voltage (VSS) is lowered.

Accordingly, when the first ground voltage (VSS) increases, the first internal circuit 10 can be connected to the second bonding wire "b" and the fourth bonding wire "d" connected in parallel to each other through the second stabilizing unit 120. Therefore, since the first internal circuit 10 can be connected to two bonding wires connected in parallel to each other, the first internal circuit 10 can be supplied with a driving voltage with a smaller amount of noise, as compared to the structure in which the first internal circuit 10 is connected to one bonding wire.

Third, the structure in which the first stabilizing unit 110 and the second stabilizing unit 120 shown in FIG. 1 respectively include the second and third transistors P21 and P22 and the fifth and sixth transistors N23 and N24 having switching functions, as shown in FIGS. 2C and 3C, will be described below.

The first stabilizing unit 110 can be configured to connect the first node (node A) and the third node (node C) when a difference between the potential levels of the first node (node A) and the third node (node C) is higher than a predetermined potential level. In this case, the predetermined potential level means threshold voltages of the second and third transistors P21 and P22.

That is, when the difference between the first external voltage (VDD) and the second external voltage (VDDQ) occurs, the first internal circuit 10 can be simultaneously supplied with the first external voltage (VDD) and the second external voltage (VDDQ). In this case, the first external voltage (VDD) and the second external voltage (VDDQ) can have the same target level.

Accordingly, when the difference between the first external voltage (VDD) and the second external voltage (VDDQ) occurs, the first internal circuit 10 can be connected to the first bonding wire "a" and the third bonding wire "c" that are connected in parallel to each other through the first stabilizing unit 110. Therefore, since the first internal circuit 10 can be connected to two bonding wires connected in parallel to each other, the first internal circuit 10 can be supplied with a driving voltage with a smaller amount of noise, as compared to the structure in which the first internal circuit 10 is connected to one bonding wire.

Similarly, when the difference between the first external voltage (VDD) and the second external voltage (VDDQ0) occurs, the second internal circuit 20 can be connected to the first bonding wire "a" and the third bonding wire "c" that are connected in parallel to each other through the first stabilizing unit 110. Therefore, since the second internal circuit 20 can be connected to two bonding wires connected in parallel to each other, the second internal circuit 20 can be supplied with a driving voltage with a smaller amount of noise, as compared to the structure in which the second internal circuit 20 is connected to one bonding wire.

The second stabilizing unit 120 can be configured to connect the second node (node B) and the fourth node (node D) when a difference between the potential levels of the second node (node B) and the fourth node (node D) is higher than a predetermined potential level. In this case, the predetermined potential level means threshold voltages of the fifth and sixth transistors N23 and N24.

That is, when the difference between the first ground voltage (VSS) and the second ground voltage (VSSQ) occurs, the first internal circuit 10 can be simultaneously supplied with the first ground voltage (VSS) and the second ground voltage (VSSQ). In this case, the first ground voltage (VSS) and the second ground voltage (VSSQ) can have the same target level.

Accordingly, when the difference between the first ground voltage (VSS) and the second ground voltage (VSSQ) occurs, the first internal circuit 10 can be connected to the second bonding wire "b" and the fourth bonding wire "d" that are connected in parallel to each other through the second stabilizing unit 120. Therefore, since the first internal circuit 10 can be connected to two bonding wires connected in parallel to each other, the first internal circuit 10 can be supplied with a driving voltage with a smaller amount of noise, as compared to the structure in which the first internal circuit 10 is connected to one bonding wire.

Similarly, when the difference between the first ground voltage (VSS) and the second ground voltage (VSSQ) occurs, the second internal circuit 20 can be connected to the second bonding wire "b" and the fourth bonding wire "d" that are connected in parallel to each other through the second stabilizing unit 120. Therefore, since the second internal circuit 20 can be connected to two bonding wires connected in parallel to each other, the second internal circuit 20 can be supplied with a driving voltage with a smaller amount of noise, as compared to the structure in which the second internal circuit 20 is connected to one bonding wire.

Figure 4:
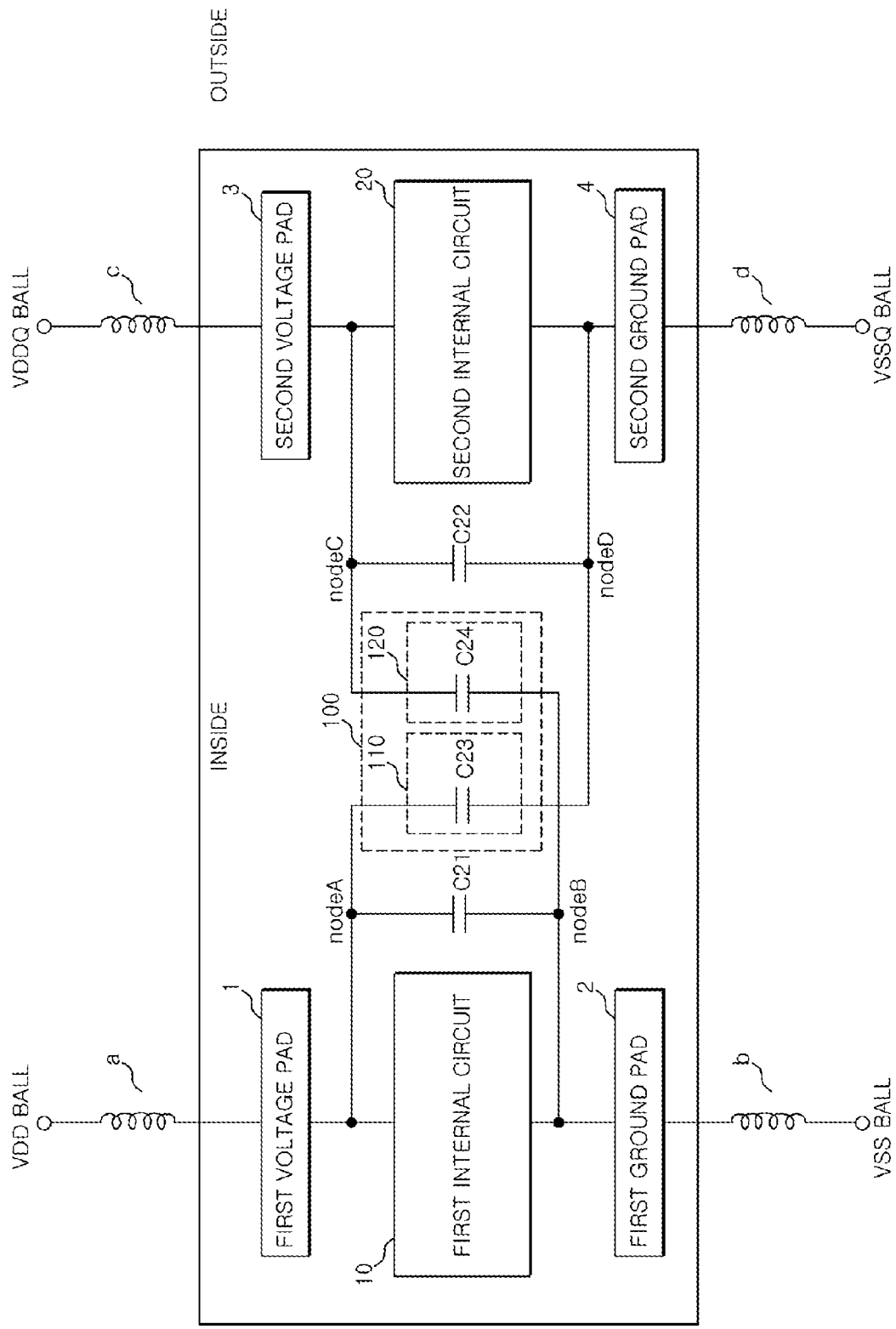
FIG. 4 is a diagram illustrating the structure of a semiconductor integrated circuit in accordance with another embodiment.

As shown in FIG. 4, a semiconductor integrated circuit according to another embodiment of the invention can include a first voltage pad 1, a first ground pad 2, a second voltage pad 3, a second ground pad 4, a first internal circuit 10, a second internal circuit 20, a first capacitor C21, a second capacitor C22, and a voltage stabilizing unit 100. The first voltage pad 1 can be supplied with a first external voltage (VDD), and the second voltage pad 3 can be supplied with a second external voltage (VDDQ). The first ground pad 2 can be supplied with a first ground voltage (VSS), and the second ground pad 4 can be supplied with a second ground voltage (VSSQ). The first external voltage (VDD) can be used as a driving voltage by a peripheral circuit of the semiconductor integrated circuit, and the second external voltage (VDDQ) can be used as a driving voltage by a data transmission circuit. The first external voltage (VDD) and the second external voltage (VDDQ) can have the same target level, and the first ground voltage (VSS) and the second ground voltage (VSSQ) can have the same target level.

The first voltage pad 1 can be supplied with the first external voltage (VDD) through a first external connection terminal (VDD ball) and a first bonding wire "a."

The first ground pad 2 can be supplied with the first ground voltage (VSS) through a second external connection terminal (VSS ball) and a second bonding wire "b."

The first internal circuit 10 can be connected between the first voltage pad 1 and the first ground pad 2.

The second voltage pad 3 can be supplied with the second external voltage (VDDQ) through a third external connection terminal (VDDQ ball) and a third bonding wire "c."

The second ground pad 4 can be supplied with the second ground voltage (VSSQ) through a fourth external connection terminal (VSSQ ball) and a fourth bonding wire "d."

The second internal circuit 20 can be connected between the second voltage pad 3 and the second ground pad 4.

The first capacitor C21 can be connected between a first node (node A) between the first voltage pad 1 and the first internal circuit 10 and a second node (node B) between the first ground pad 2 and the first internal circuit 10. The first capacitor C21 can be configured to maintain a constant voltage between the first node (node A) and the second node (node B). That is, the first capacitor C21 can be configured to transmit noise of the first external voltage (VDD) supplied from the first voltage pad 1 to the first ground pad 2.

The second capacitor C22 can be connected between a third node (node C) between the second voltage pad 3 and the second internal circuit 20 and a fourth node (node D) between the second ground pad 4 and the second internal circuit 20. The second capacitor C22 can be configured to maintain a constant voltage between the third node (node C) and the fourth node (node D). That is, the second capacitor C22 can be configured to transmit noise of the second external voltage (VDDQ) supplied from the second voltage pad 3 to the second ground pad 2.

The voltage stabilizing unit 100 can include a first stabilizing unit 110 and a second stabilizing unit 120.

The first stabilizing unit 110 can be connected between the first node (node A) and the fourth node (node D). The first stabilizing unit 110 can be configured to transmit noise of the first external voltage (VDD) supplied from the first node (node A) to the second ground pad 4 through the fourth node (node D). That is, the first stabilizing unit 110 can be configured to maintain a voltage difference between the first node (node A) and the fourth node (node D) to be constant.

The first stabilizing unit 110 can include a third capacitor C23 connected between the first node (node A) and the fourth node (node D). The third capacitor C23 can be configured to serve as a filter that does not transmit DC components, but transmits voltage noise, that is, AC components. The larger the amount of noise included in the voltage applied to the third capacitor C23 becomes, the smaller the impedance of the third capacitor C23 becomes. The third capacitor C23 can be configured to maintain a voltage difference between the first node (node A), that is, a voltage terminal of the first internal circuit 10, and the fourth node (node D), that is, a ground terminal of the second internal circuit 20 to be constant.

The second stabilizing unit 120 can be connected between the second node (node B) and the third node (node C). The second stabilizing unit 120 can be configured to transmit noise of the second external voltage (VDDQ) supplied from the third node (node C) to the first ground pad 2 through the second node (node B). That is, the second stabilizing unit 120 can be configured to maintain a voltage difference between the second node (node B) and the third node (node C) to be constant.

The second stabilizing unit 120 can include a fourth capacitor C24 connected between the second node (node B) and the third node (node C). The fourth capacitor C24 can be configured to serve as a filter that does not transmit DC components, but transmits voltage noise, that is, AC components. The larger the amount of noise included in the voltage applied to the fourth capacitor C24 becomes, the smaller the impedance of the fourth capacitor C24 becomes. The fourth capacitor C24 can be configured to maintain a voltage difference between the third node (node C), that is, a voltage terminal of the second internal circuit 20, and the second node (node B), that is, a ground terminal of the first internal circuit 10 to be constant.

The semiconductor integrated circuit having the above-mentioned structure according to this embodiment can be configured to operate as follows.

The first bonding wire "a" can be connected to the first internal circuit 10, the first capacitor C21, and the third capacitor C23 through the first voltage pad 1. The first internal circuit 10 and the first capacitor C21 can be connected to the second bonding wire "b" through the first ground pad 2. The third capacitor C23 can be connected to the fourth bonding wire d through the second ground pad 4.

Therefore, the first bonding wire "a" and the second bonding wire "b" can form a first current path, and the first bonding wire "a" and the fourth bonding wire "d" can form a second current path. This means that the first bonding wire "a" and the second and fourth bonding wires "b" and "d" can be connected in parallel to each other. A total inductance of the second and fourth bonding wires "b" and "d" connected in parallel to each other through the first stabilizing unit 110 is smaller than that of two bonding wires connected respectively to the first and second internal circuits 10 and 20, which results in a reduction in counter electromotive force.

The third bonding wire "c" can be connected to the second and fourth bonding wires "b" and "d," which in turn can be connected in parallel to each other through the second stabilizing unit 120. A total inductance of the second and fourth bonding wires "b" and "d" connected in parallel to each other can be smaller than that of two bonding wires connected respectively to the first and second internal circuits 10 and 20.

The second bonding wire "b" can be connected to the first and third bonding wires "a" and "c," which in turn can be connected in parallel to each other through the second stabilizing unit 120. A total inductance of the first and third bonding wires "a" and "c" connected in parallel to each other is smaller than that of two bonding wires connected respectively to the first and second internal circuits 10 and 20.

The fourth bonding wire "d" can be connected to the first and third bonding wires "a" and "c," which in turn can be connected in parallel to each other through the first stabilizing unit 110. A total inductance of the first and third bonding wires "a" and "c" connected in parallel to each other is smaller than that of two bonding wires connected respectively to the first and second internal circuits 10 and 20.

That is, in the semiconductor integrated circuit according to this embodiment, the bonding wires "a," "b," "c," and "d" connected to the internal circuits 10 and 20 can be connected in parallel to one another, and a total inductance of the bonding wires can be reduced. Therefore, the counter electromotive force caused by the inductance can also be weakened, and the amount of voltage noise can also be reduced.

Figure 5:
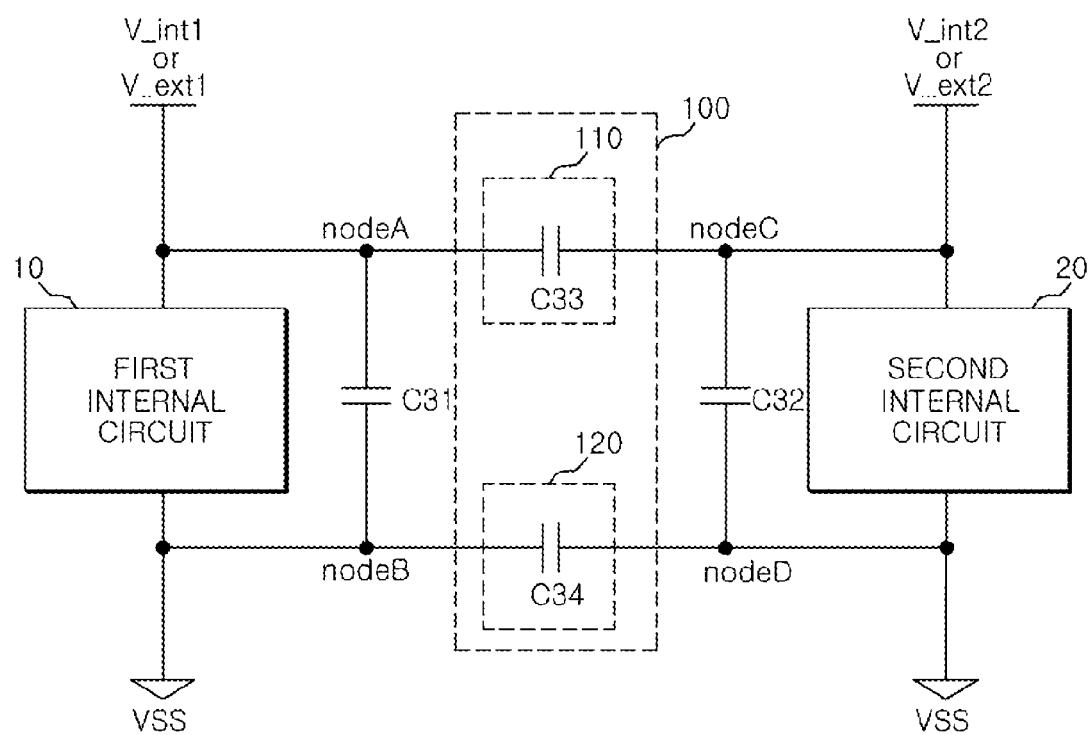
FIG. 5 is a diagram illustrating the structure of a semiconductor integrated circuit in accordance with still another embodiment.

As shown in FIG. 5, a semiconductor integrated circuit according to still another embodiment can include a first internal circuit 10, a second internal circuit 20, a first capacitor 31, a second capacitor C32, and a voltage stabilizing unit 100.

The first internal circuit 10 can be supplied with a first external voltage (V_ext1) or a first internal voltage (V_int1) and is connected to a ground terminal (VSS).

The second internal circuit 20 can be supplied with a second external voltage (V_ext2) or a second internal voltage (V_int2) and is connected to the ground terminal (VSS).

The first capacitor 31 can be connected between a first node (node A) through which the first internal circuit 10 can be supplied with the first external voltage (V_ext1) or the first internal voltage (V_int1) and a second node (node B) connected to the first internal circuit 10 and the ground terminal (VSS). The first capacitor 31 can be configured to transmit noise of the voltage applied to the first internal circuit 10 to the ground terminal (VSS). That is, the first capacitor 31 can be configured to enable the first internal circuit 10 to be supplied with a constant voltage.

The second capacitor 32 can be connected between a third node (node C) through which the second internal circuit 20 can be supplied with the second external voltage (V_ext2) or the second internal voltage (V_int2) and a fourth node (node D) connected to the second internal circuit 20 and the ground terminal (VSS). The second capacitor 32 can be configured to transmit noise of the voltage applied to the second internal circuit 20 to the ground terminal (VSS). That is, the second capacitor 32 can be configured to enable the second internal circuit 20 to be supplied with a constant voltage.

The voltage stabilizing unit 100 can include a first stabilizing unit 110 and a second stabilizing unit 120. The first stabilizing unit 110 can be connected to the first node (node A) and the third node (node C). The first stabilizing unit 110 can be configured to apply some of the noises of the first external voltage (V_ext1) or the first internal voltage (V_int1) supplied to the first capacitor C31 to the second capacitor C32.

The first stabilizing unit 110 can include a third capacitor C31 connected to the first node (node A) and the third node (node C).

The second stabilizing unit 120 can be connected to the second node (node B) and the fourth node (node D). The second stabilizing unit 120 can be supplied with noise of the voltage applied to the first capacitor C31 and the second capacitor C32 and can transmit it to the ground terminal VSS.

The second stabilizing unit 120 can include a fourth capacitor C32 connected to the second node (node B) and the fourth node (node D).

The semiconductor integrated circuit having the above-mentioned structure according to this embodiment can be configured to operate as follows.

The first stabilizing unit 110 can be configured to apply noise of the first external voltage (V_ext1) or the first internal voltage (V_int1) to the first and second capacitors C31 and C32. The second stabilizing unit 120 can be configured to transmit noise of the voltage applied to the first and second capacitors C31 and C32 to the ground terminal (VSS).

That is, noise of the first external voltage (V_ext1) or the first internal voltage (V_int1) applied to the first internal circuit 10 can be transmitted to the ground terminal (VSS) through the two capacitors C31 and C32. In addition, noise of the second external voltage (V_ext2) or the second internal voltage (V_int2) applied to the second internal circuit 20 can be transmitted to the ground terminal (VSS) through the two capacitors C31 and C32. In other words, the first internal circuit 10 can be connected to the first capacitor C31 and the second capacitor C32 through the first and second stabilizing units 110 and 120. When the first internal circuit 10 is connected to the first and second capacitors C31 and C32 connected in parallel to each other through the first and second stabilizing units 110 and 120, the first internal circuit 10 can be supplied with a smaller amount of voltage noise, as compared to when the first internal circuit 10 is connected to only the first capacitor C31. This is because a total capacitance of the capacitors connected in parallel to each other is larger than the capacitance of one capacitor.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor integrated circuit comprising:
    a first capacitor that is connected between a voltage terminal directly connected to a first internal circuit and a ground terminal directly connected to the first internal circuit;
    a second capacitor that is connected between a voltage terminal directly connected to a second internal circuit and a ground terminal directly connected to the second internal circuit; and
    a voltage stabilizing unit that is configured to provide noise of the voltage that is supplied to the first capacitor to the second capacitor,
    wherein the voltage stabilizing unit is directly connected between the first capacitor and the second capacitor.

2. The semiconductor integrated circuit of claim 1, wherein the voltage stabilizing unit includes a filter that is connected between the voltage terminal of the first internal circuit and the voltage terminal of the second internal circuit.

3. The semiconductor integrated circuit of claim 1, wherein the voltage stabilizing unit includes a filter that is connected between the ground terminal of the first internal circuit and the ground terminal of the second internal circuit.

4. The semiconductor integrated circuit of claim 2, wherein the filter has impedance that is reduced as the frequency of the noise of the voltage increases.

5. The semiconductor integrated circuit of claim 3, wherein the filter has impedance that is reduced as the frequency of the noise of the voltage increases.

6. The semiconductor integrated circuit of claim 4, wherein the filter includes a third capacitor.

7. The semiconductor integrated circuit of claim 5, wherein the filter includes a third capacitor.

8. The semiconductor integrated circuit of claim 1,
    wherein the voltage stabilizing unit includes:
    a first stabilizing unit that is connected between the voltage terminal of the first internal circuit and the voltage terminal of the second internal circuit; and
    a second stabilizing unit that is connected between the ground terminal of the first internal circuit and the ground terminal of the second internal circuit.

9. The semiconductor integrated circuit of claim 8,
    wherein the first stabilizing unit includes a third capacitor, which is a first filter having impedance that is reduced as the frequency of noise of the voltage applied to the voltage terminal of the first internal circuit and the voltage terminal of the second internal circuit increases, and
    the second stabilizing unit includes a fourth capacitor, which is a second filter having impedance that is reduced as the frequency of noise of the voltage applied to the ground terminal of the first internal circuit and the ground terminal of the second internal circuit increases.

10. The semiconductor integrated circuit of claim 1, wherein the voltage stabilizing unit maintains a voltage difference between the voltage terminal of the first internal circuit and the ground terminal of the second internal circuit to be constant.

11. The semiconductor integrated circuit of claim 10, wherein the voltage stabilizing unit includes a third capacitor that is connected between the voltage terminal of the first internal circuit and the ground terminal of the second internal circuit.

12. The semiconductor integrated circuit of claim 1, wherein the voltage stabilizing unit includes:
    a third capacitor, which is a first stabilizing unit connected between the voltage terminal of the first internal circuit and the ground terminal of the second internal circuit; and
    a fourth capacitor, which is a second stabilizing unit connected between the voltage terminal of the second internal circuit and the ground terminal of the first internal circuit.

* * * * *